United States Patent [19]

Ingram et al.

[11] 4,142,159

[45] Feb. 27, 1979

[54] MISSING PULSE DETECTOR FOR A VARIABLE FREQUENCY SOURCE

[75] Inventors: Charles B. Ingram, Harriman; John H. Lawhorn, Concord, both of Tenn.

[73] Assignee: The United States of America as represented by the United States Department of Energy, Washington, D.C.

[21] Appl. No.: 849,200

[22] Filed: Nov. 7, 1977

[51] Int. Cl.$^2$ .................. H03K 5/18; H03K 5/156; H03K 3/284
[52] U.S. Cl. ................................. 328/120; 307/261; 307/273; 328/129
[58] Field of Search .................. 307/232, 261, 273; 328/120, 129, 130

[56] References Cited

U.S. PATENT DOCUMENTS

| | | | |
|---|---|---|---|
| 3,204,189 | 8/1965 | Trautwein | 328/120 |
| 3,518,456 | 6/1970 | Mauduit et al. | 328/120 X |
| 3,536,935 | 10/1970 | Watson, Jr. et al. | 328/120 X |
| 3,569,744 | 3/1971 | Garrahan | 328/120 X |
| 3,652,943 | 3/1972 | Piccirilli et al. | 328/120 |

OTHER PUBLICATIONS

Jenny, "Missing Pulse Detector"; IBM Tech. Discl. Bull.; vol. 2, No. 4, pp. 66-67; Dec. 1959.
Carlson et al., "System for Eliminating Home Emitter Wheel"; IBM Tech. Discl. Bull.; vol. 15, No. 11, pp. 3368-3369; Apr. 1973.

Primary Examiner—Larry N. Anagnos
Attorney, Agent, or Firm—Dean E. Carlson; Stephen D. Hamel; David E. Breeden

[57] ABSTRACT

A missing pulse detector is provided which has the capability of monitoring a varying frequency pulse source to detect the loss of a single pulse or total loss of signal from the source. A frequency-to-current converter is used to program the output pulse width of a variable period retriggerable one-shot to maintain a pulse width slightly longer than one-half the present monitored pulse period. The retriggerable one-shot is triggered at twice the input pulse rate by employing a frequency doubler circuit connected between the one-shot input and the variable frequency source being monitored. The one-shot remains in the triggered or unstable state under normal conditions even though the source period is varying. A loss of an input pulse or single period of a fluctuating signal input will cause the one-shot to revert to its stable state, changing the output signal level to indicate a missing pulse or signal.

3 Claims, 1 Drawing Figure

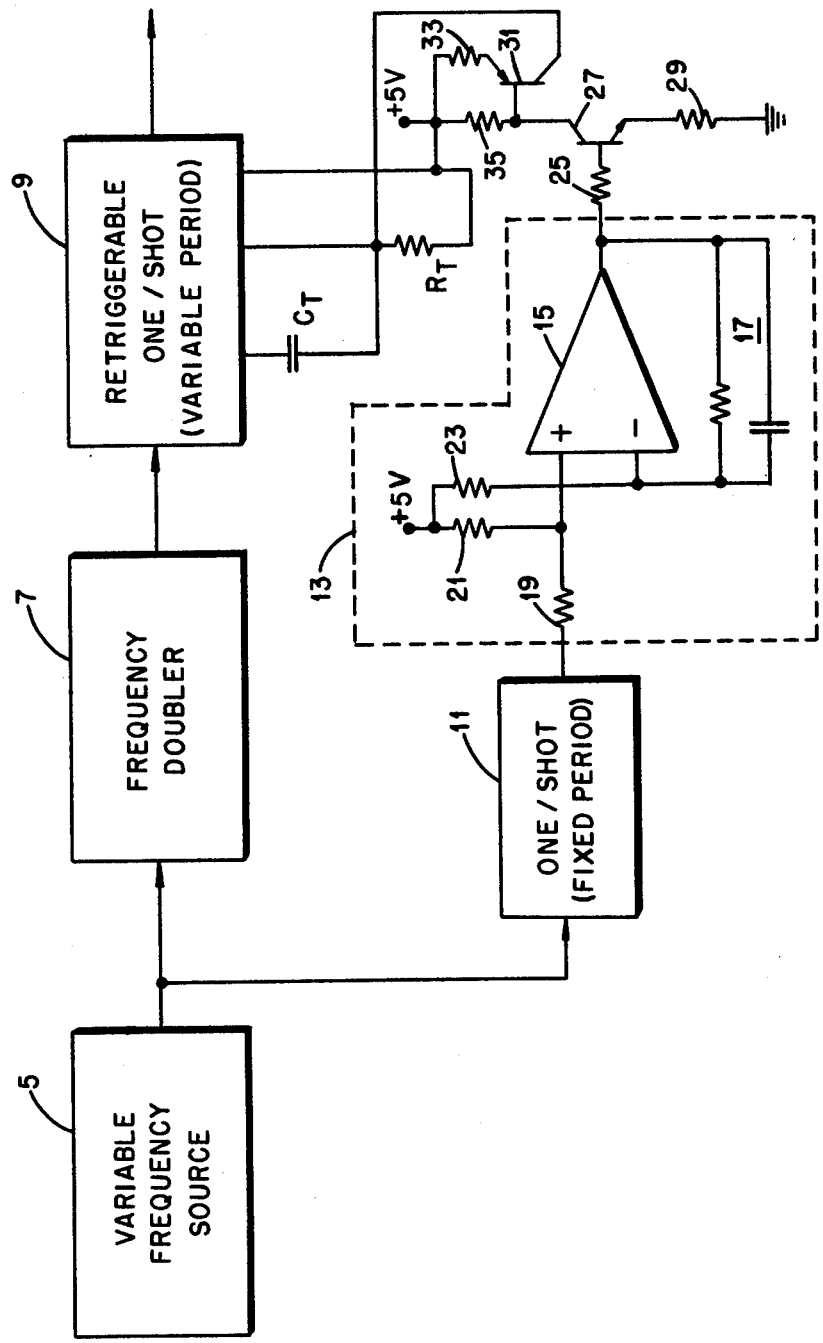

MISSING PULSE DETECTOR FOR A VARIABLE FREQUENCY SOURCE

BACKGROUND OF THE INVENTION

This invention was made during the course of, or under, a contract with the U.S. Department of Energy.

This invention relates generally to missing pulse detectors and more specifically to a missing pulse detector for monitoring variable frequency pulse sources.

In the art of frequency monitoring it is often necessary to monitor a frequency source in a frequency sensitive system, such as a motor control system and various other applications, wherein it is necessary or desirable to activate a disconnect or some other control operation within the time frame of a single period of the frequency source. This action is necessary to prevent system overloads or unstable operation which could damage a control system. Conventional loss of signal detectors typically are designed to detect a loss of signal only at a predetermined source frequency and are not capable of detecting a loss of signal if the frequency of the signal being monitored is varying. A need, therefore, exists to provide a loss of signal detector capable of monitoring a signal source having a varying frequency.

SUMMARY OF THE INVENTION

In view of the above need it is a primary object of the present invention to provide a missing pulse detector for detecting a loss of signal from a variable frequency source.

Further it is an object of this invention to provide a missing pulse detector for detecting loss of signal from a variable frequency source wherein a variable period retriggerable one-shot is provided which has a trigger input connected to the output of a frequency doubler. Means are provided for converting the frequency signal from the source to a proportional current signal for adjusting the pulse width of the output signal of the retriggerable one-shot such that the pulse width is maintained slightly greater than one-half the period of the prevailing signal from the frequency source in order that successive trigger signals from the frequency doubler will maintain the retriggerable one-shot in an unstable state. A loss of signal from this frequency source will allow the one-shot to revert to a stable state within the time frame of one period of the prevailing signal from the variable frequency source.

Other objects and many of the attendant advantages of the present invention will be obvious from the following detailed description taken in conjunction with the drawing wherein the drawing includes a single figure which is a schematic diagram of a missing pulse detector for use with a variable frequency source according to the present invention.

DETAILED DESCRIPTION

Referring now to the drawing, a variable frequency source 5 which is to be monitored by the circuit has an output connected to the input of a frequency doubler circuit 7. The variable frequency source to be monitored may take various forms such as a sine wave signal source, a square wave source, a pulse period modulated source, etc. Likewise, the frequency doubler may take various forms of well known circuit techniques for obtaining frequency doubling or multiplication.

The output of the frequency doubler is connected to the trigger input of a conventional retriggerable one-shot 9. The retriggerable one-shot differs from a conventional one-shot in that it may be retriggered to maintain the output at the logic level indicating the unstable state before the one-shot times out and reverts to the stable state. Thus by maintaining the period of the one-shot just slightly greater than half the period of the signal from the frequency source, the retriggerable one-shot will remain in the unstable state as long as the source signal is available to the input of the frequency doubler 7. A typical retriggerable one-shot which may be operated in this manner is a model SN74123 integrated circuit manufactured by Signetics, Inc., Sunnyvale, Calif. This particular one-shot has an output pulse width:

$$T_W = 0.32 \, R_T C_T (1 + 0.7/R_T)$$

where $R_T$ and $C_T$ as shown in the figure are connected externally of the integrated circuit for period control and may be further connected to an active circuit to adjust the period of the one-shot.

In order to adjust the period of the one-shot 9, the output of the frequency source 5 is connected to the input of a fixed period one-shot 11. The period of one-shot 11 is selected so that it is slightly smaller than the period of the maximum frequency of the variable source 5. Thus the output of one-shot 11 presents fixed period pulses at a repetition rate corresponding to the source 5 frequency. The output of one-shot 11 is connected to the input of a frequency-to-current converter shown within the dashed lines 13. The converter 13 is of conventional design wherein an operational amplifier 15 is provided with a parallel RC feedback network 17 coupled between the output of amplifier 15 and the inverting input thereof. The output of the one-shot 11 is connected through a resistor 19 to the non-inverting and input of amplifier 15. Both the non-inverting and the inverting inputs of amplifier 15 are connected to a +5 volt supply through resistors 21 and 23 respectively. The purpose of the resistors 21 and 23 is to bias the inputs of amplifier 15 to provide the necessary offset in the output voltage to overcome the voltage drop between the base and the emitter of a transistor 27 controlled by amplifier 15.

Thus the output of amplifier 15 supplies a current whose magnitude is proportional to the frequency of the fixed period pulses from one-shot 11 which is varied in accordance with the output of the variable frequency source 5. This current signal is used to control the current flow through an active control circuit which essentially presents a variable impedance in parallel with the resistor $R_T$ and in turn varies the RC time constant of the RC circuit ($R_T C_T$) to vary the period of the retriggerable one-shot 9.

To accomplish this the output of amplifier 15 is connected through a resistor 25 to the base of the NPN transistor 27. The emitter of transistor 27 is connected to ground through a resistor 29 and the collector is connected to the base of a PNP transistor 31. The collector of transistor 31 is connected to the common connection point between the capacitor $C_T$ and the resistor $R_T$. The emitter of transistor 31 is connected to the +5 volt supply through a resistor 33. The base of transistor 31 is connected to the +5 volt supply through a biasing resistor 35. The resistor $R_T$ is also connected to the +5 volt supply, which is also the supply for the retriggerable one-shot 9 as shown by the connection between the +5 volt supply and the one-shot 9.

An increase in the frequency of the signal from the source 5 causes an increase in the current available at the output of amplifier 15. This increases the current flow through transistor 27 which in turn increases the current flow through transistor 31 decreasing the effective RC time constant controlling the retriggerable one-shot 9 period. Alternatively, a decrease in the source frequency causes a corresponding decrease in the current available at the output of amplifier 15 which decreases the current flow through transistors 27 and 31, thereby increasing the RC time constant controlling the period of one-shot 9. The circuit parameters are adjusted so that the period of one-shot 9 is maintained just slightly greater than the prevailing period of one cycle of the output of the frequency doubler 7. Thus retriggerable one-shot 9 maintains a constant output level corresponding to the triggered or unstable state. A loss of signal or a single pulse from the variable frequency source will prevent the frequency doubler from maintaining its output signal rate so that the retriggerable one-shot is not retriggered in sufficient time to prevent it from reverting to its stable state, changing the signal level of the output. This change in signal level at the output of the retriggerable one-shot may be used to disconnect the power suply from a motor in a motor control system or may be used in various other control schemes which require action immediately if a loss of signal occurs.

Thus it will be seen that a very simple and effective means has been provided for detecting a loss of signal from a variable frequency signal source. It will be obvious to those skilled in the art that various modifications and changes may be made in the illustrated embodiment without departing from the spirit and scope of the invention as set forth in the following claims attached to and forming a part of this specification.

What is claimed is:

1. A missing pulse detector for detecting a loss of signal from a variable frequency source comprising:

a variable period retriggerable one-shot having a variable period control input;

means responsive to said variable frequency source for generating and applying a trigger signal to a triggering input of said one-shot having twice the frequency of the signal from said source; and means for generating a period control signal proportional to the frequency of the prevailing signal from said variable frequency source and applying said control signal to said period control input of said retriggerable one-shot such that the period of said retriggerable one-shot is maintained slightly greater than one-half the period of the prevailing signal frequency of said source in order that successive triggering signals from said trigger signal generating means will maintain said retriggerable one-shot in an unstable state and a loss of signal from said frequency source causes said one-shot to revert to a stable state within one period of the prevailing signal from said variable frequency source.

2. The missing pulse detector as set forth in claim 1 wherein said means for generating a trigger signal is a frequency doubler circuit.

3. The missing pulse detector as set forth in claim 2 wherein said period control input of said variable period retriggerable one-shot includes an RC period timing circuit connected thereto and wherein said means for generating a period control signal includes a fixed period one-shot having an input connected to the output of said source and generating fixed period pulses at an output thereof having the same frequency as the prevailing signal from said source, a frequency-to-current converter connected to the output of said fixed period one-shot for generating a current at an output thereof proportional to the frequency of said source and an active control circuit means responsive to the current signal from said converter for varying the impedance of said RC timing circuit proportional to the magnitude of the current from said converter thereby varying the period of said retriggerable one-shot.

* * * * *